(12) United States Patent
Shibuya et al.

(10) Patent No.: US 7,135,064 B2
(45) Date of Patent: Nov. 14, 2006

(54) SILICA-BASED COATING FILM ON SUBSTRATE AND COATING SOLUTION THEREFOR

(75) Inventors: Tatsuhiko Shibuya, Yokohama (JP); Yoshio Hagiwara, Tokyo-to (JP)

(73) Assignee: Tokyo Ohka Kogyo Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/067,622

(22) Filed: Feb. 28, 2005

(65) Prior Publication Data

US 2005/0147833 A1 Jul. 7, 2005

Related U.S. Application Data

(62) Division of application No. 09/302,471, filed on Apr. 30, 1999, now Pat. No. 6,875,262.

(30) Foreign Application Priority Data

May 26, 1998 (JP) ................. 10-144807
May 26, 1998 (JP) ................. 10-144808

(51) Int. Cl.
  *C09D 183/06* (2006.01)
(52) U.S. Cl. ................. 106/287.13; 106/287.14; 106/287.16
(58) Field of Classification Search .......... 106/287.13, 106/287.15, 287.16
  See application file for complete search history.

(56) References Cited

U.S. PATENT DOCUMENTS

| 4,865,649 A | 9/1989 | Kashiwagi et al. |
| 6,261,357 B1 | 7/2001 | Egami et al. |
| 6,875,262 B1 * | 4/2005 | Shibuya et al. ......... 106/287.13 |

FOREIGN PATENT DOCUMENTS

| JP | 54-72300 | | 6/1979 |
| JP | 63-112429 | * | 5/1988 |
| JP | 2-672 | | 1/1990 |
| JP | 2-672 | * | 5/1990 |
| JP | 2-209927 | | 8/1990 |
| JP | 3-54279 | | 3/1991 |
| JP | 5-125187 | | 5/1993 |
| JP | 05-125187 | * | 5/1993 |
| JP | 03008709 | | 9/1993 |
| JP | 06-83063 | * | 3/1994 |
| JP | 07-315881 | * | 12/1995 |
| JP | 09-208237 | * | 8/1997 |
| JP | 9-249673 | | 9/1997 |
| JP | 9-315812 | | 12/1997 |

OTHER PUBLICATIONS

CA PLUS AN 1996:115506, Naganami, "Formation of coatings", Dec. 5, 1995.
CA PLUS AN 1997:542658, Takei et al., "Manufacture of silica glass by sol-gel process", Aug. 12, 1997.
CA PLUS AN 1995: 248289, "UV-sensitive polymerizable composition", Mar. 25, 1994.
CA PLUS AN 1988: 514996, "Manufacture of silica glass by col-gel . . . ", May 17, 1988.

* cited by examiner

*Primary Examiner*—David M. Brusman
(74) *Attorney, Agent, or Firm*—Wenderoth, Lind & Ponack, L.L.P.

(57) ABSTRACT

A silica-based coating film having a low dielectric constant not exceeding 2.5 can be formed on the surface of a substrate to serve as a planarizing layer or an interlayer insulating layer by coating the surface with a unique coating solution containing a hydrolysis-condensation product of a polyalkoxy silane compound such as tetraethoxy silane and monomethyl trimethoxy silane, which is formed by the hydrolysis of a polyalkoxy silane in the presence of a basic catalyst such as ammonia in an alcohol solvent in a relatively low concentration followed by replacement of the alcohol solvent with an aprotic polar solvent such as N-methyl pyrrolidone, followed by drying and baking at 350 to 800° C.

6 Claims, No Drawings

SILICA-BASED COATING FILM ON SUBSTRATE AND COATING SOLUTION THEREFOR

This is a divisional of Ser. No. 09/302,471, filed Apr. 30, 1999, now U.S. Pat. No. 6,875,262.

BACKGROUND OF THE INVENTION

The present invention relates to a silica-based coating film on a substrate surface and a coating solution for the formation of a silica-based coating film on a substrate surface. More particularly, the invention relates to a silica-based coating film having a low dielectric constant formed on a substrate surface in the manufacturing process of various kinds of semiconductor devices to serve as a planarizing layer, interlayer insulating layer and the like as well as to a coating solution containing a specific hydrolysis-condensation product of a hydrolyzable silane compound for the formation of a silica-based coating film.

It is conventional in the manufacturing process of semiconductor devices that, when a planarizing layer or interlayer insulating layer has to be formed, a silica-based coating film is formed on the substrate surface to serve for the purpose. Several methods are utilized for the formation of such a silica-based coating film on a substrate surface including the chemical vapor-phase deposition (CVD) method, coating method by the use of a coating solution and others.

The CVD method, when applied to the formation of a silica-based coating film, is conducted by using a specialized apparatus in which silica optionally doped with phosphorus or boron is vapor-deposited to grow a silica-based coating film on the substrate surface. In the solution-coating method for the formation of a silica-based coating film, on the other hand, the surface of a substrate is coated with a coating solution containing a partial hydrolysis-condensation product of an alkoxy silane compound dissolved in an organic solvent followed by baking of the coating layer to complete the silica-based coating film, in which the hydrolysis-condensation reaction of the alkoxy silane compound in an organic solvent is performed usually in the presence of an acidic catalyst.

One of the serious problems in the electronic information-processing technology in recent years is that, along with the increasing trend of semiconductor devices toward a higher and higher degree of multiplication of multilayered pattern structure and fineness of patterning, a delay is caused in the signal transmission not to allow high velocity working of ULSIs. A large number of proposals have been made for a solution of this problem including an idea to employ a dielectric material of a low dielectric constant for the interlayer insulating layer.

For example, a proposal is made for an insulating film of silica doped with fluorine, referred to as an SiOF film hereinafter, as formed by the CVD method. One of the problems in the SiOF film is the expensiveness of the CVD apparatus therefor resulting in high costs. In addition, the SiOF film contains a Si—F linkage having high reactivity which reacts with water in the atmosphere to form an Si—OH linkage having an effect of increasing the dielectric constant of the film. Accordingly, the dielectric constant of SiOF films can rarely be lower than about 3.3.

In the solution-coating method for the formation of a silica-based coating film, proposals are made for the use of methyl polysiloxanes and hydrogen silsesquioxanes having a relatively low dielectric constant, such as a hydrolysis-condensation product of a dimethyl alkoxy silane and methyl silsesquioxane, as the film-forming constituent in the coating solution. The dielectric constant of the films consisting of a methyl polysiloxane and hydrogen silsesquioxane, however, can be about 2.8 and 3.3, respectively, at the lowest and a dielectric film having a dielectric constant lower than 2.8 can hardly be obtained. Accordingly, the solution-coating method by using these coating solutions cannot meet the requirements in the modern semiconductor devices for a lower and lower dielectric constant of the silica-based coating films.

It is a known technology that a poly(methylsilsesquioxane) powder as a filler for use in synthetic resins and rubbers and coating compositions are prepared from a polyalkoxy silane compound by conducting the hydrolysis-condensation reaction thereof in the presence of a basic catalyst (see, for example, Japanese Patent Kokai 54-72300 and 2-209927 for the powder and Japanese Patent Kokai 2-627 for the coating composition). No proposals have been made heretofore, however, on the application of such a technology to hydrolyze a polyalkoxy silane compound in the presence of a basic or alkaline catalyst for the preparation of a coating solution which can be used for the formation of a silica-based coating film on a substrate surface in the manufacturing process of semiconductor devices.

A method is disclosed in Japanese Patent Kokai 5-125187 for the preparation of a poly(organosilsesquioxane) having an extremely high molecular weight by promoting condensation of a low-degree hydrolysis-condensation product of a trialkoxy silane compound in the presence of an alkaline catalyst. Further, a proposal is made for the formation of a silica-based coating film having a low dielectric constant by using a coating solution obtained by conducting the hydrolysis treatment of an alkoxy silane compound in two steps including the first step in which the hydrolysis reaction is conducted in the presence of an alkaline catalyst to give a low-degree hydrolysis product which is further hydrolyzed in the second step in the presence of an acidic catalyst. The above described methods, however, are defective due to the low stability of the silica-based coating films obtained thereby and, even if the problem of stability is set aside, due to the dielectric constant of the coating films not low enough which is 3.8 at the lowest to be much higher than the target value of 2.5 desirable in the manufacture of semiconductor devices.

SUMMARY OF THE INVENTION

The present invention accordingly has a primary object to provide a silica-based coating film having a dielectric constant of as low as 2.5 or even lower to be useful as a planarizing surface layer or interlayer insulating layer on a substrate surface in the manufacture of semiconductor devices.

The invention has a further object to provide a coating solution for use in the formation of a high-quality silica-based coating film mentioned above on the surface of a substrate as well as a method of using the same for the formation of a high-quality silica-based coating film.

Thus, the coating solution provided by the present invention for the formation of a silica-based coating film is a uniform solution which comprises:

(A) an organic solvent; and
(B) an organopolysiloxane, which is a hydrolysis-condensation product of a polyalkoxy silane compound represented by the general formula $$R^1_{4-n}Si(OR^2)_n, \quad (I)$$

in which $R^1$ is a hydrogen atom or a monovalent hydrocarbon group, $R^2$ is an alkyl group and the subscript n is 2, 3 or 4, dissolved in the organic solvent in the presence of a basic compound.

The above defined coating solution of the present invention can be prepared by a method which comprises the steps of:
(a) dissolving the above defined polyalkoxy silane compound in a first organic solvent, which is preferably an alcohol solvent, to give a solution, in a concentration in the range from 1 to 5% by weight calculated as $SiO_2$;
(b) admixing the solution with a basic compound and water to effect hydrolysis of the polyalkoxy silane compound forming a hydrolysis-condensation product thereof; and
(c) replacing the first organic solvent in the solution with a second organic solvent, which is preferably an aprotic polar organic solvent, in such an amount that the concentration of the hydrolysis-condensation product of the polyalkoxy silane compound in the solution is in the range from 5 to 25% by weight calculated as $SiO_2$.

In the formation of a silica-based coating film on the surface of a substrate, the substrate surface is coated with the coating solution described above to give a coating layer of the solution which is dried and then subjected to a heat treatment at a temperature of 350° C. or higher.

The thus obtained silica-based coating film is characterized by the dielectric constant thereof which does not exceed 2.5.

DETAILED DESCRIPTION OF THE PREFERRED EMBODIMENTS

As is described above, the starting material in the preparation of the inventive coating solution is a polyalkoxy silane compound having two or more alkoxy groups bonded to the silicon atom in the molecule as represented by the general formula (I). The group denoted by $R_1$ in the formula is a hydrogen atom or a monovalent hydrocarbon group which is preferably an alkyl group having 1 to 4 carbon atoms including methyl, ethyl, propyl and butyl groups. The group denoted by $R^2$ in the formula is also an alkyl group having 1 to 4 carbon atoms including methyl, ethyl, propyl and butyl groups. The subscript n in the formula is 2, 3 or 4.

Examples of the polyalkoxy silane compound suitable as the starting material of the inventive coating solution includes tetraalkoxy silanes such as tetramethoxy silane, tetraethoxy silane, tetrapropoxy silane and tetrabutoxy silane; monoalkyl trialkoxy silanes such as monomethyl trimethoxy silane, monomethyl triethoxy silane, monoethyl trimethoxy silane, monoethyl triethoxy silane, monomethyl dimethoxy monoethoxy silane and monoethyl dimethoxy monoethoxy silane; dialkyl dialkoxy silanes such as dimethyl dimethoxy silane, dimethyl diethoxy silane, dimethyl dipropoxy silane, diethyl dimethoxy silane, diethyl diethoxy silane, diethyl dipropoxy silane, monomethyl monoethyl dimethoxy silane and monomethyl monoethyl diethoxy silane; and trialkoxy silanes such as trimethoxy silane, triethoxy silane, tripropoxy silane and tributoxy silane.

Although any one of the above named silane compounds can be used for the purpose either singly or as a combination of two kinds or more, particularly preferable are tetraalkoxy silanes such as tetramethoxy silane and tetraethoxy silane, trialkoxy silanes such as trimethoxy silane and triethoxy silane, and monoalkoxy trialkoxy silanes such as monomethyl trimethoxy silane and monomethyl triethoxy silane since these silane compounds can give a silica-based coating film having a still lower dielectric constant than the other polyalkoxy silane compounds.

In the preparation of the inventive coating solution, the polyalkoxy silane compound described above is dissolved in a first organic solvent to give a solution in a concentration in the range from 1 to 5% by weight calculated as $SiO_2$ to be subjected to a hydrolysis reaction therein in the presence of a basic catalyst. The reason for this limitation in the silane concentration is as follows. In the conventional hydrolysis reaction of an alkoxy silane compound in the presence of an acidic catalyst, the hydrolysis reaction is initiated as an electrophilic substitution reaction by the hydrogen ions to form a silanol compound having one or two silanolic hydroxyl groups which pertain to the dehydration condensation reaction forming a polysiloxane species of which the weight-average molecular weight can rarely exceed 2000 to 5000. In the hydrolysis reaction of an alkoxy silane compound in the presence of a basic catalyst, in contrast thereto, the hydrolysis reaction is initiated as a nucleophilic substitution reaction by the hydroxyl ions readily to form a silanolic compound having up to four silanolic hydroxyl groups in a molecule which pertain more easily to the dehydration condensation giving a polysiloxane species having a weight-average molecular weight of as large as several tens of thousands to several hundreds of thousands so that the solution sometimes causes gelation. This disadvantage due to gelation of the solution can be avoided when the concentration of the alkoxy silane compound to be hydrolyzed in the solution is so low as to be within the above mentioned range of low concentrations.

The organic solvent as the first solvent in which the hydrolysis reaction of the polyalkoxy silane compound is effected is not particularly limitative provided that the polyalkoxy silane compound, water and basic catalytic compound are each soluble therein and the hydrolysis reaction of the polyalkoxy silane compound and the following dehydration condensation reaction of the hydrolysis product are not adversely influenced thereby. Examples of organic solvents suitable as the first solvent includes lower alcohols such as methyl, ethyl and propyl alcohols, ketones such as acetone and methyl ethyl ketone and polyhydric alcohols and derivatives thereof such as ethyleneglycol, diethyleneglycol, propyleneglycol and dipropyleneglycol as well as their monomethyl, monoethyl, monopropyl and monobutyl ethers, dimethyl, diethyl, dipropyl and dibutyl ethers, monomethyl ether acetate and monoethyl ether acetate, of which the alcoholic solvents are preferable although any of these organic solvents can be used either singly or as a mixture of two kinds or more.

The hydrolysis reaction of the polyalkoxy silane compound in the thus prepared solution proceeds by the addition of water and a basic compound as the catalyst to the solution. In order for the reaction to proceed at a moderate rate, the amount of the basic catalyst should be adequately selected in the range from $10^{-1}$ to $10^{-5}$ mole or, preferably, from $10^{-2}$ to $10^{-4}$ mole per mole of the polyalkoxy silane compound. The basic compound to serve as the basic catalyst should be free from any metallic elements such as sodium and potassium since metallic elements remaining in the silica-based coating layer may sometimes adversely affect the performance of the semiconductor device. In this regard, the basic compound is selected from the group consisting of ammonia in the form of ammonia water and organic amine compounds including aromatic amine compounds such as aniline and N-methyl aniline and lower aliphatic tertiary amines such as triethylamine, tripropylamine, tributylamine, triethanolamine and tripropanolamine. These basic compounds can be used either singly or as a combination of two kinds or more.

The amount of water added to the solution of the polyalkoxy silane compound in the first organic solvent to serve as the reactant in the hydrolysis reaction is in the range, usually, from 2.0 to 20 moles or, preferably, from 4.0 to 10 moles per mole of the polyalkoxy silane compound though dependent on the number of the alkoxy groups per molecule of the polyalkoxy silane compound. When the silane solution is prepared according to the above described formulation, the hydrolysis-condensation reaction of the polyalkoxy silane proceeds at room temperature. The hydrolysis-condensation reaction is performed at a temperature in the range, usually, from 0 to 70° C. or, preferably, from 20 to 25° C. The length of time taken for the hydrolysis-condensation reaction is, though dependent on the reaction temperature, selected in the range, usually, from 1 to 100 hours or, preferably, from 5 to 50 hours in order for the dehydration condensation reaction of the silanol groups following the hydrolysis reaction to proceed to a full extent.

After completion of the hydrolysis-dehydration condensation of the polyalkoxy silane compound in the first organic solvent to give a solution of the hydrolysis-condensation product, the first organic solvent which is preferably an alcohol solvent is replaced with a second organic solvent which is preferably an aprotic polar solvent selected from the group consisting of N-methyl pyrrolidone, dimethylformamide and dimethylacetamide either singly or as a combination of two kinds or more to give a solution of the hydrolysis-condensation product in the second organic solvent.

It is presumable that, different from the hydrolysis reaction of a polyalkoxysilane compound in the presence of an acidic catalyst, the silanol compound formed by the hydrolysis reaction with a basic catalyst has an increased number of silanolic hydroxyl groups per molecule so that the solution of the hydrolysis-condensation product is more liable to further dehydration condensation reaction leading to eventual gelation of the solution with a decreased storage stability as a trend. It has been unexpectedly discovered that, when the alcoholic solvent as the first organic solvent in the solution of the hydrolysis-condensation product is replaced with an aprotic polar solvent mentioned above as the second organic solvent in a specified concentration, the storage stability of the solution can be greatly improved.

The concentration of the hydrolysis-condensation product in this solution, which is the coating solution of the present invention, is in the range from 5 to 25% by weight calculated as $SiO_2$. Although this concentration is substantially higher than in the solution with the first organic solvent, the solution is safe from the trouble of gelation.

The coating solution prepared in the above described manner is used for the formation of a silica-based coating film on the surface of a substrate which is not particularly limitative. For example, the coating film is formed on the surface of a semiconductor silicon wafer having a circuit wiring layer of a metal such as aluminum to serve as an interlayer insulating layer. A silicon wafer having an underresist layer in the multilayered resist method can be provided with the silica-based coating film as an intermediate layer by using the coating solution. Further, a planarizing layer can be formed using the coating solution on a silicon wafer having a metallic circuit wiring layer and an interlayer insulating layer formed thereon by the CVD method or on a silicon wafer having a circuit wiring layer of polycrystalline silicon.

The method for the application of the inventive coating solution onto the substrate surface is not particularly limitative and can be selected depending on the types of the substrate surface from those conventionally undertaken in the manufacturing process of semiconductor devices including spray coating method, spin coating method, dip coating method and roller coating method, of which the spin coating method is the most widely applicable.

The coating layer of the coating solution on the substrate surface is then subjected to a drying treatment by which the solvent in the wet coating layer is evaporated to leave a dried coating film. The conditions of the drying treatment are not particularly limitative relative to the temperature and time. It is usual that the substrate bearing a wet coating layer is heated for several minutes in an atmosphere of air or an inert gas such as nitrogen on a hot plate at a temperature of 80 to 300° C., preferably, by increasing the temperature in several steps in order to ensure good uniformity of the dried coating film. For example, the first step heating is undertaken at 80 to 100° C. of the hot plate temperature for 30 seconds to 2 minutes, the second step heating is undertaken at 120 to 170° C. for 30 seconds to 2 minutes and the final step heating is undertaken at 190 to 300° C. for 30 seconds to 2 minutes.

In the next place, the thus dried coating film on the substrate surface is subjected to a baking treatment at a temperature of 350° C. or higher or, preferably, in the range from 350 to 800° C. for 15 to 60 minutes in an atmosphere of an inert gas such as nitrogen or an oxidizing gas such as air depending on the types of the device under processing so that the coating film is converted into a silica-based coating film. The upper limit of the baking temperature also depends on the types of the semiconductor devices. When the substrate surface bears a circuit wiring layer of aluminum, for example, the baking treatment is conducted in a non-oxidizing atmosphere at a temperature not exceeding 500° C. When the baking temperature is too low or the baking time is too short, conversion of the coating film to a silica-based coating film would be incomplete.

The thickness of the silica-based coating film thus formed on the surface of a substrate in the above described manner is naturally varied depending on the particular object of coating film formation but, in most cases, the thickness is in the range from 0.2 to 1.0 μm. The dielectric constant of the silica-based coating film can be as low as 2.5 or even lower.

In the following, the present invention is described in more detail by way of examples, which, however, never limit the scope of the invention in any way.

EXAMPLE 1

Into a uniform solution prepared by dissolving, in 887.9 g of methyl alcohol, 36.0 g (2.0 moles) of pure water and 69.47 μg of ammonia water (28% by weight concentration) were gradually added dropwise under agitation 76.10 g (0.5 mole) of tetramethoxy silane as a polyalkoxy silane compound to form a reaction mixture which was further agitated at room temperature for about 5 hours followed by standing as such for 48 hours. The concentration of the tetramethoxy silane in the reaction mixture corresponded to 3% by weight calculated as $SiO_2$.

Thereafter, the reaction mixture was admixed with N-methyl pyrrolidone and subjected to an evaporation treatment on a rotary evaporator to remove methyl alcohol by evaporation. The thus obtained solution in N-methyl pyrrolidone as a coating solution for the formation of a silica-based coating film contained the hydrolysis-condensation product of tetramethoxy silane in a concentration corresponding to 10% by weight calculated as $SiO_2$.

The thus prepared coating solution was uniformly applied to the surface of a semiconductor silicon wafer on a spin coater to give a coating layer which was dried by heating on a hot plate successively at 80° C., 150° C. and 200° C. each for 1 minute followed by a baking treatment at 400° C. for 30 minutes in an atmosphere of nitrogen gas to give a silica-based coating film having a thickness of 0.4 μm.

The silica-based coating film on the substrate surface prepared above had a dielectric constant of 2.2.

EXAMPLE 2

The experimental procedure was substantially the same as in Example 1 excepting for the replacement of tetramethoxy silane with the same molar amount (68.10 g) of monomethyl trimethoxy silane, decrease of the amount of pure water from 36.0 g to 27.0 g and increase of the amount of methyl alcohol from 887.9 g to 905.9 g in the preparation of the coating solution of which the concentration of the hydrolysis-condensation product of the silane compound was 10% by weight calculated as $SiO_2$.

The silica-based coating film formed in the same manner as in Example 1 from this coating solution had a dielectric constant of 2.3.

EXAMPLE 3

The experimental procedure was substantially the same as in Example 1 excepting for the replacement of tetramethoxy silane with the same molar amount (82.15 g) of triethoxy silane, decrease of the amount of pure water from 36.0 g to 27.0 g and increase of the amount of methyl alcohol from 887.9 g to 890.9 g in the preparation of the coating solution of which the concentration of the hydrolysis-condensation product of the silane compound was 10% by weight calculated as $SiO_2$.

The silica-based coating film formed in the same manner as in Example 1 from this coating solution had a dielectric constant of 2.2.

COMPARATIVE EXAMPLE

A coating solution was prepared by dissolving a ladder-formed hydrolysis-condensation product obtained by hydrolyzing monomethyl triethoxy silane in the presence of an acidic catalyst in ethyl alcohol in a concentration corresponding to 10% by weight calculated as $SiO_2$.

The silica-based coating film formed in the same manner as in Example 1 from this coating solution had a dielectric constant of 2.8.

What is claimed is:

1. A silica-based coating film formed on the surface of a substrate, which film has a dielectric constant not exceeding 2.5, said film being produced by applying to the surface of said substrate, a uniform solution comprising:
    (A) an organic solvent; and
    (B) an organopolysiloxane, which is a hydrolysis-condensation product of a polyalkoxy silane compound represented by the general formula $R^1_{4-n}Si(OR^2)n$, in which $R^1$ is a hydrogen atom or a monovalent hydrocarbon group, $R^2$ is an alkyl group and the subscript n is 2, 3 or 4, said uniform solution being produced by steps comprising:
    (a) dissolving said polyalkoxy silane compound in a first organic solvent, which is an alcohol solvent, to give a solution, in a concentration in the range from 1 to 5% by weight calculated as $SiO_2$;
    (b) admixing the solution with a basic compound and water to effect hydrolysis of the polyalkoxy silane compound so as to give said organopolysiloxane as a hydrolysis-condensation product thereof; and
    (c) replacing the first organic solvent in the solution with a second organic solvent, which is an aprotic polar organic solvent, in such an amount that the concentration of the organopolysiloxane in the solution is in the range from 5 to 25% by weight calculated as $SiO_2$.

2. The silica-based coating film as claimed in claim 1 wherein the basic compound is ammonia or an amine compound.

3. The silica-based coating film according to claim 2 wherein the basic compound is ammonia.

4. The silica-based coating film according to claim 1 wherein the amount of the basic compound is in the range from $10^{-1}$ to $10^{-5}$ mole per mole of the polyalkoxy silane compound.

5. The silica-based coating film according to claim 1 in which the amount of water is in the range of from 2.0 to 20 moles per mole of the polyalkoxy silane compound.

6. The silica-based coating film as claimed in claim 1 in which the aprotic polar organic solvent is selected from the group consisting of N-methyl pyrrolidine, dimethylformanide and dimethylacetamide.

* * * * *

UNITED STATES PATENT AND TRADEMARK OFFICE
CERTIFICATE OF CORRECTION

| | | |
|---|---|---|
| PATENT NO. | : 7,135,064 B2 | Page 1 of 1 |
| APPLICATION NO. | : 11/067622 | |
| DATED | : November 14, 2006 | |
| INVENTOR(S) | : Tatsuhiko Shibuya et al. | |

It is certified that error appears in the above-identified patent and that said Letters Patent is hereby corrected as shown below:

In column 8, line 50, "manide" should read -- mamide --.

Signed and Sealed this

Thirtieth Day of January, 2007

JON W. DUDAS
*Director of the United States Patent and Trademark Office*